United States Patent [15] 3,651,957
Ball et al. [45] Mar. 28, 1972

[54] CHIP PACKAGING AND TRANSPORTING APPARATUS

[72] Inventors: John F. Ball, Scottsdale; Rex R. Beatty, Phoenix, both of Ariz.

[73] Assignee: Motorola, Inc., Franklin Park, Ill.

[22] Filed: Mar. 2, 1970

[21] Appl. No.: 15,401

[52] U.S. Cl. ....................... 214/1 BC, 214/1 BH, 294/64, 294/106
[51] Int. Cl. ....................... B66c 1/02
[58] Field of Search ....................... 294/106, 64; 214/1 BC, 1 BH

[56] References Cited

UNITED STATES PATENTS

| | | | |
|---|---|---|---|
| 3,362,545 | 1/1968 | Rowe | 294/106 X |
| 3,411,641 | 11/1968 | Dean | 294/64 X |
| 2,974,811 | 3/1961 | Dammert | 214/1 BH |
| 3,209,922 | 10/1965 | Melvin | 214/1 BT |

FOREIGN PATENTS OR APPLICATIONS

| | | | |
|---|---|---|---|
| 667,639 | 7/1963 | Canada | 294/106 |

*Primary Examiner*—Gerald M. Forlenza
*Assistant Examiner*—George F. Abraham
*Attorney*—Mueller and Aichele

[57] ABSTRACT

Means are provided to remove an assembly comprising a frame, a chip and a substrate from the support on which they are assembled. That means comprises moveable fingers which are rotated out of frame contacting position by power means such as compressed air and which are rotated into the frame contacting position by springs.

8 Claims, 6 Drawing Figures

PATENTED MAR 28 1972

3,651,957

Figure 1:
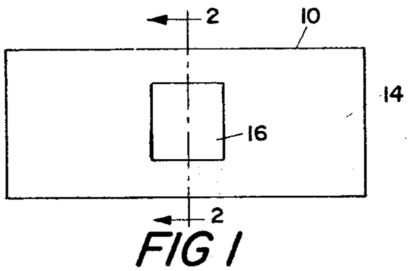

INVENTORS
John F. Ball
Rex R. Beatty
BY
Mueller, Aichele, & Rauner
Attys

INVENTORS
John F. Ball
Rex R. Beatty
BY
Mueller, Aichele, & Rauner
Atty's

CHIP PACKAGING AND TRANSPORTING APPARATUS

BACKGROUND

In packaging a chip, a substrate is placed on a support and a lead frame is placed on the substrate. The substrate includes a support layer of vitreous glass and a surface layer of non-vitreous glass surrounding a central portion which is often gold plated. The support is heated to the softening point of the non-vitreous glass whereby the softened glass wets and adheres to the contacting portions of the lead frame. The chip is then placed in an oriented position in the center of the gold plated portion of the substrate and pressed down on the gold plated surface and vibrated with respect thereto whereby the gold plated back of the chip is bonded to the gold plated surface of the substrate. In those cases where the central portion is also of glass, the chip is pressed down in the softened glass then the hot assembly of substrate, lead frame and chip are removed from the support and the process is repeated. In accordance with the prior art, the substrate and the lead frame are put on the heated support manually with the help of a tweezers, for example, and the chip is oriented on a moveable pad and placed on the central portion of the substrate by vacuum applied to a post. The post also presses the chip onto the central portion, and vibrates it with respect to the substrate. Other vacuum means are used to take the assembly off the support, however, the assembly is relatively large and heavy and may stick to the support to a greater or less extent. Also, the completed package may not have any smooth areas large enough so that the end of a hollow tube would be blocked for air suction on the exposed upper surface of the assembly. That is, the assembled package does not lend itself to being removed from the support by suction means. The result is that the operator must remove the assembly from the support in a large percentage of the cycles of operation, slowing the operation and adding to the cost of the assembly, and often even warping the assembly in the process.

It is an object of this invention to provide an improved apparatus for removing a substrate, lead frame and chip assembly from a heating support.

SUMMARY

In accordance with this invention, teeth are rotarily mounted on a support. The teeth in one position thereof are so placed that they clear the ends of the lead frame. In another position of the teeth, the teeth are in a position to contact the lead frame and particularly the end bars of the lead frame. The teeth are moved to and held in one of their positions by air pressure against the bias provided by a spring. The spring tends to move the teeth to the other of their contacting positions and will do so upon release of the air pressure. Where the teeth are held in their first position by air pressure, the pressure applied by the teeth to the frame is not great enough to injure the frame. The teeth may be ends of respective T-shape levers. If desired, the teeth and the air cylinder assembly are slideably mounted on a block so that the spacing therebetween may be varied to accommodate different size assemblies. The block has a hole therethrough for motion of a suction post, which also acts as a bonding post, which places a chip on the substrate and bonds it to the central portion of the substrate.

DESCRIPTION

Figure 2:
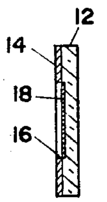
Figure 3:
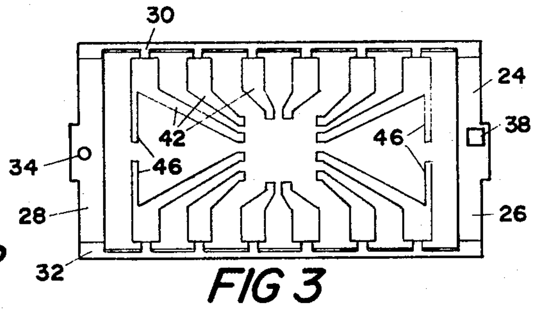
Figure 5:
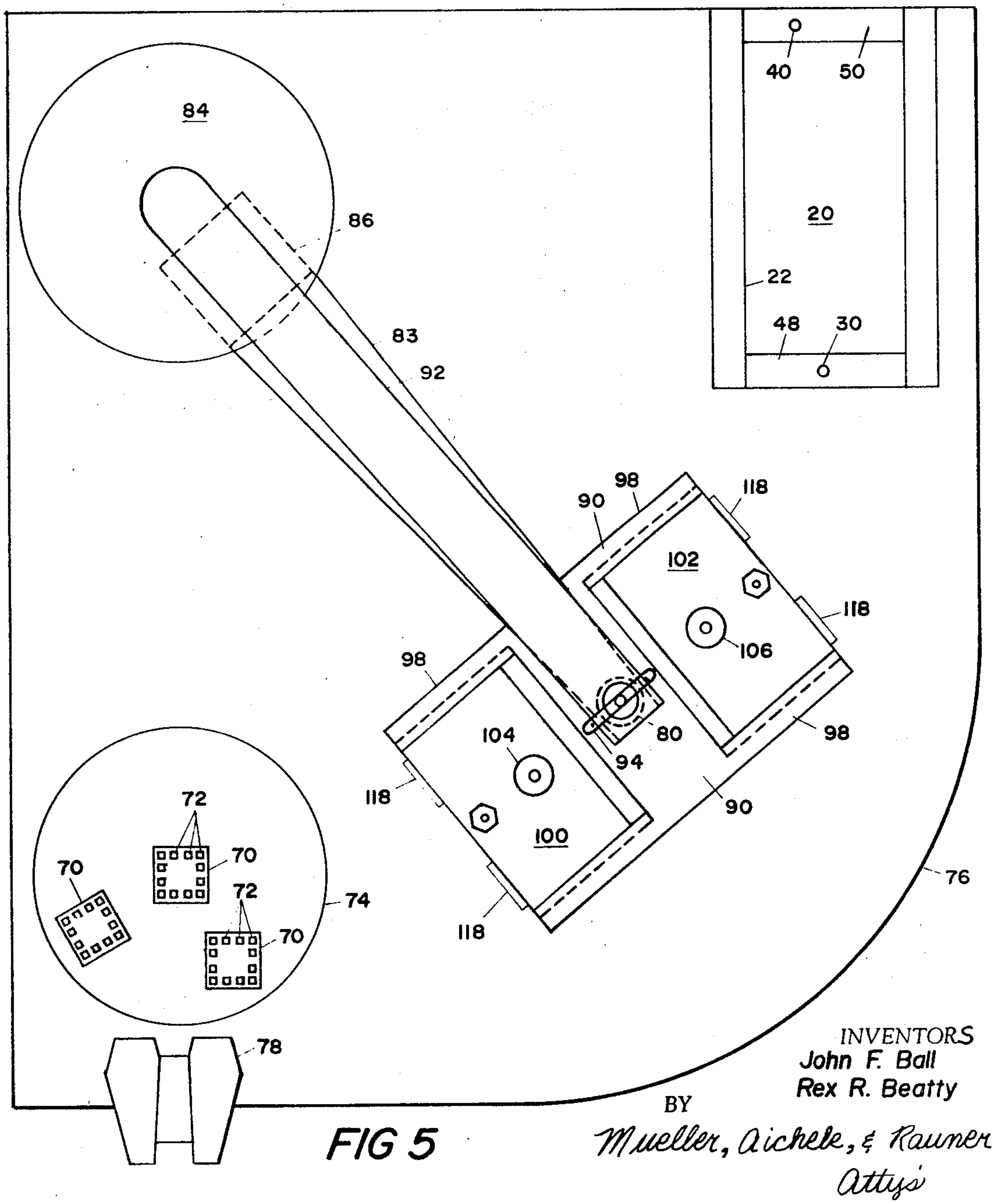
Figure 4:
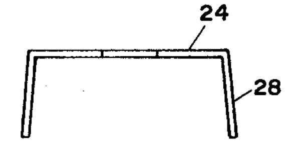
Figure 6:
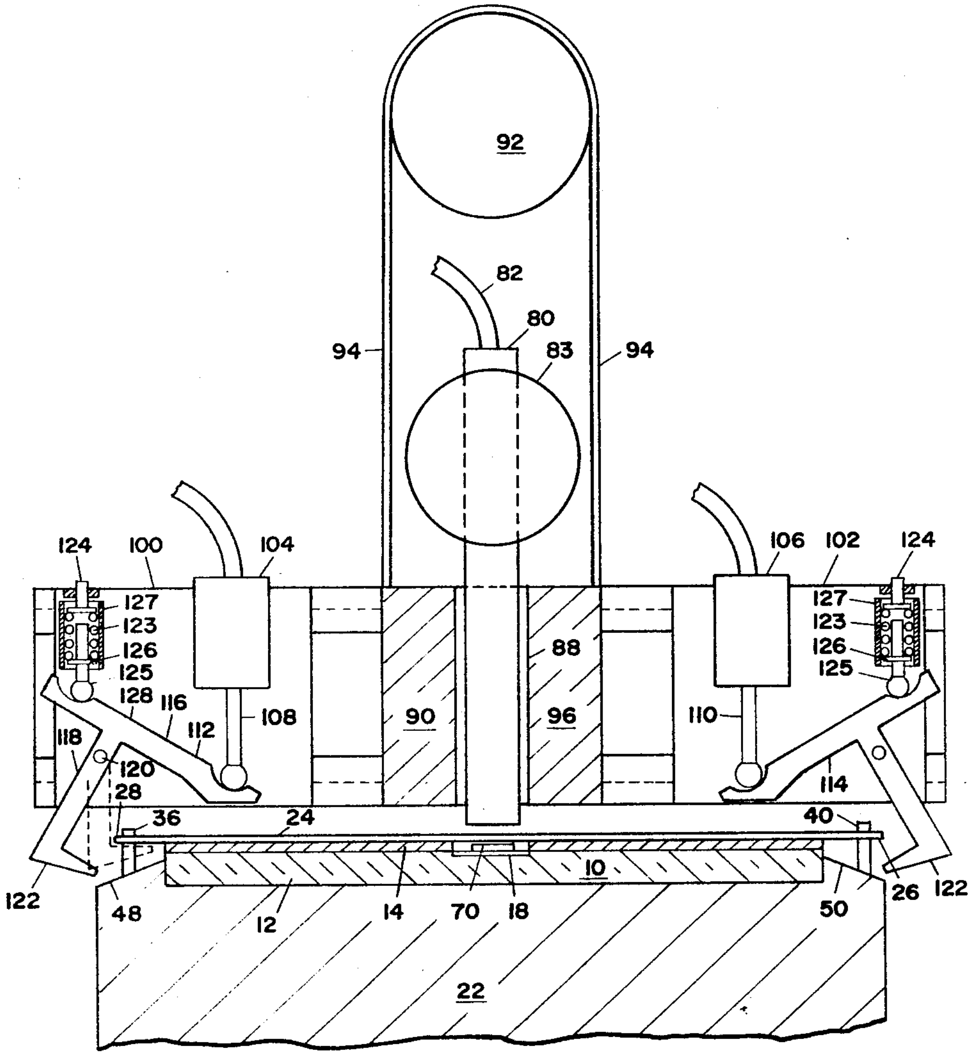

The invention will be better understood upon reading the following description in connection with the accompanying drawing in which FIG. 1 is a plan view of a substrate to be used in the package assembly, FIG. 2 is a sectional view of the substrate of FIG. 2 taken on line 2—2 thereof, FIG. 3 is a plan view of a lead frame to be fixed to the substrate of FIG. 1, FIG. 4 is an end view of the lead frame of FIG. 3, and FIG. 5 is a plan view of a machine for assembling a substrate of FIGS. 1 and 2, a lead frame of FIG. 3 and 4 and a chip of FIG. 5, and FIG. 6 is an enlarged sectional view of the assembly raising portion of FIG 5.

Turning first to FIG. 1, a substrate 10 is shown. This substrate 10 comprises a bottom layer 12 of vitreous glass and a top layer 14 of non-vitreous glass which may cover the whole top of the substrate. However, in the embodiment shown, a hole 16 is formed in the middle of the top layer 14 and part way into the bottom layer 12 and the exposed portion of the bottom layer 12 is covered with a coating of gold 18. The substrate 10 may be ½ inch wide by 1¼ inches long and may be about 1/16th inch thick. The substrate 10 is put into a cavity 20 that it fits into in the top of a support 22, as shown in FIGS. 5 and 6.

A lead frame 24 is shown in FIGS. 3 and 4. The lead frame 24 comprises end bars 26 and 28 and edge bars 30 and 32. A round hole 34 is formed in the middle of the bar 28 to receive the round post 36 extending upward from the support 22. A retangular hole 38 is formed in the bar 26 to receive a round post 40 extending off center from the opposite end of the support 22 from which the round post 36 extends. Leads 42 are provided. These leads extend from the bars 30 and 32 parallel to each other for a portion of their length and then end in such a manner as to leave an open space between their ends. The leads 42 are insulated from each other except for their connection to the bars 30 and 32. The leads 42 are of different shape and length. In FIG. 3, the center portion of the leads 42 and of the bars 26 and 28 lie in the same plane and the end portions of the leads 42 and the bars 26 and 28 are bent to form the U-shape shown in FIG. 4. However, all the leads and all the bars may be in the same plane if desired. While only 12 leads are shown, any number may be used, 24 being a typical number. It is noted that the end leads 42 have inwardly and parallelly extending spurs 46. The spurs 46 prevent flow of the non-vitreous glass, when softened as will be explained, over the edges of the substrate 10. The lead frame 24 is placed on the support 22 over the substrate 14, with the pins 36 and 40 respectively in the holes 34 and 38. The support 22 is heated by means not shown and the non-vitreous glass 14 softens and the softened glass 14 wets the portions of the leads 42 that are in contact therewith and the spurs 46. The bars 26 and 28 are spaced in an end-wise direction from the ends of the substrate 14 whereby the bars 26 and 28 are not stuck to the substrate 10. The positions of the bars 26 and 28 with respect to the pins 36 and 40 and the substrate 10 that is in the hole 20 provided in the top of the support 22 is shown in FIG. 6.

As noted, the support 22 has a pocket or hole 20 to receive the substrate 10. The support 22 also has downwardly slanting edges 48 and 50 to provide clearance for the teeth 122, 122 when they are in their dotted position in FIG. 6, as will be explained, between the end edges 50 and 48 of the support 22 and the bars 26 and 28. The pins 36 and 40 extend upwardly from the slanting edges 48 and 50 respectively. The lateral edges of the support 22 (not shown) are slanted to fit the slant of the lateral edges of the frame 24 as shown in FIG. 4. The support 22 is heated by any known means to the softening temperature of the non-vitreous glass portion 14 of the substrate 10.

The chip 70 (see FIG. 5) has circuits thereon (not shown) and bonding pad 72 thereon, there being one bonding pad 72 on each chip 70 for each lead 42. The chips 70 are quite small and are to be properly oriented and placed on the gold plated portion 18 of the substrate 10 as shown in FIG. 6 and bonded thereto.

The chips 70 shown in FIG. 5 are oriented by moving a plate 74 on which they are positioned in a universal manner with respect to the table 76 on which the plate 74 is placed, until a chip 70 lines up with the reticle in the microscope 78. The properly positioned and oriented chip 70 is then picked up by a hollow post 80 having suction applied thereto by a hose 82. The post 80 is mounted for motion up and down with respect to a horizontal support post 83 which is fixed to a rotatable turret 84, also mounted on the table 76. A vibrator 86 is positioned in the turret 84 and is fixed to the horizontal post 83 to vibrate it when the vibrator 86 is energized. The post 80 fits loosely in a hole 88 in a block 90 see FIG. 6. The block 90 is supported from the housing 84 by a cylindrical horizontal support post 92, which also turns with turret 84, and by a strap 94. The posts 83 and 92 can move up and down parallelly with respect to the top of the support 22 and independently of each other, whereby the post 80 and the assembly picking up means to be described can be moved up and down independently of each other.

The block 90 comprises a bridge portion 96 having the hole 88 therein and dove-tailed portions 98 extending parallel to each other and away from the bridge 96 at opposite sides thereof. Slideable blocks 100 and 102 are supported in a dove-tailed portions 98. Air pressure cylinders 104 and 106 are mounted one on each of the blocks 100 and 102 respectively. As shown in FIG. 6, the ends of the piston rods 108 and 110 respectively, press against the ends of a bent of T-shaped lever 112 and 114 respectively. The lever 112 includes two perpendicularly extending bar portions 116 and 118, the bar 118 extending from a mid portion of the bar 116. The lever 112 is pivoted on a pin 120 extending through the bar portion 118 near the bar portion 116 and into the block 100. A tooth 122 extends in the direction of the bar portion 116 from the bar portion 118. The top of the tooth 112 is perpendicular to the bar portion 118 and the bottom of the tooth 122 slants upwardly with respect to the portion 118. A compression spring 123 extends between an adjustable anchor 124 and a rod 125 having a collar 126 thereon. The other end of the rod 125 presses against the extension of the bar 116 away from the air cylinder 104. The spring is contained in a cylinder 127. The anchor 124 and the cylinder 127 are fixed to the block 100. The lever 114 is exactly like the lever 112 and is mounted in the same manner but on the slideable block 102 and facing the lever 112, thereby it is not separately described. The levers 112 and 114 are urged to rotate in the direction to take the dotted positions shown in FIG. 6 by their respective springs 123, whereby the top of the teeth 122 are below the bars 28 and 26 and parallel thereto and the teeth 122 fit between the slanted portions 48 and 50 and the bars 28 and 26. The air pressure in the air cylinders 104 and 106 hold the teeth 122 in their solid positions whereby they clear the end bars 26 and 28 of the frame 24.

The device disclosed operates as follows: a chip 70 is moved under observation through the microscope 78 as by moving the dish 74 or as by moving an individual chip with a tweezers to an oriented position with respect to a reticle in the microscope 78. In the meantime, a substrate 10 is placed in the pocket 20 of the heated support 22 and a frame 24 is positioned on a substrate 10 and properly positioned with respect to the pins 36 and 40 as explained above. Within seconds the non-vitreous glass portion of the substrate 10 is melted. After a predetermined heating period, the leads 42 are fixed to the substrate 10 and the turret 84 is turned so that the post 80 is over the positioned chip 70 and the vacuum is turned on for picking up the chip 70. The turret 84 is turned to the position where the chip 70 is over the center of the substrate 10 and between the inner ends of the leads 42 and the post 80 goes down to apply pressure to the chip 70 and the vibrator 86 is turned on to bond the gold plated back of the chip 70 to the gold plated surface 18 if a gold plated surface area 18 is provided or to the vitreous glass if no gold plated surface 18 is provided. In the meantime, the air pressure is on in the cylinders 104 and 106, holding the teeth 122 in the position shown in FIG. 6 and the block 90 is above the frame 24 far enough to clear it. As soon as the chip bonding operation is completed, the block 90 is lowered until the bottom of the block presses the leads 42 into the softened glass 14. The teeth 122 are in the position as shown in FIG. 6 and the air is released from the cylinders 104 and 106. The levers 112 and 114 turn under the urging of the springs 123 and the teeth 122 take the position shown in dotted lines, whereby the tops of the teeth 122 are under the bars 26 and 28 and are parallel thereto. The post 92 is then raised to lift the assembly comprising the substrate 10, the lead frame 24 and the chip 70 off of the heated support 22. The turret 84 is then turned until the position shown in FIG. 5 is reached when the air pressure is applied to the cylinders 104 and 106 whereby the teeth 122 recede from the bars 26 and 28 and the assembly falls on to the table 76 and a new cycle is started. Spring pressure is used to urge the teeth 122 in the direction of the bars 26 and 28 since the force applied to the assembly may be limited by picking the proper strength of springs 123 or the anchors 124 may be adjusted with respect to the blocks 100 and 102 to adjust the power of the springs 123. By this adjustment of the power of the springs, damage is not done to the assembly by the teeth 122. However, if desired, the cylinders and the springs may be reversed in position.

While tension compression springs 123 are used, tension springs (not shown) may be provided. One pair of teeth 122 is shown in FIG. 6, however, if desired, two pairs of teeth may be used, a tooth of each pair being at each end of the block 90 as shown by the four reference characters 118 in FIG. 5, the bars 118 being integrally attached to the teeth 122. In the case where four teeth 122 are used, the cylinders 104 and 106 may each operate on two physically connected levers 112 or 114 at the opposite ends of the block 90. The moveable blocks 100 and 102 are slideable with respect to the block 90 so that the same assembly may cooperate with different size supports 22 and with different size frames 24.

What is claimed is:

1. In apparatus for the assembly of a semiconductor device which has parts including a semiconductor unit and mounting means and leads for such unit with the assembly being completed at a work station in the apparatus from which it must be removed while in heated condition without disturbing the assembled position of the parts in such semiconductor device, said apparatus including a work table with a work station for carrying thereon semiconductor units and with a heated work station at which to assemble said parts into a device, and said apparatus having lifting and transport mechanism therewith for lifting and transporting a semiconductor unit to said assembly work station and lifting and transporting a semiconductor device away from said assembly work station, said mechanism including a horizontally extending structure movably mounted in said apparatus to move in a path from one of said work stations to another work station over said work table, and a vertically extending structure supported from said horizontally extending structure, said vertically extending structure including a mounting portion adapted to be raised and lowered relative to the work table and adapted to be moved over said work station path upon movement of the horizontally extending structure, said mounting portion having movable supporting means on each of two opposite sides thereof which are movable on said mounting portion toward and away from one another, lifting and transporting means pivotally mounted on each of said movable supporting means, each said lifting and transporting means having an actuating arm portion and a lifting arm portion transversely positioned relative to said actuating arm portion, with the actuating arm portion being selectively movable to pivot the entire lifting and transporting means and move the lifting arm portion into a holding position relative to a completed semiconductor device on the assembly work station for lifting the device therefrom, means for raising the vertically extending structure and the mounting portion therewith to simultaneously lift therewith said lifting and transporting means on each said movable supporting means to lift the device from said work station and for moving the horizontally extending structure to a position in the apparatus for depositing said device, and means for pivoting said lifting and transporting means out of holding position to so deposit the device.

2. In the apparatus of claim 1 wherein said horizontally extending structure includes a cylindrical support post operatively connected to said mounting portion and said mounting portion includes a block upon which the movable supporting means are slidably moved toward and away from one another to adjust the spacing between lifting and transporting means on each said movable supporting means.

3. In the apparatus of claim 1 wherein said lifting and transporting means on each movable supporting means comprises a substantially T-shaped member with an actuating arm portion and a lifting arm portion extending transversely to one another and with the lifting arm portion having a claw on the end thereof, and actuating means selectively engaging one end portion or the other end portion of the actuating arm portion thereof to pivot the lifting and transporting means in or out of lifting and holding position at the claw for a semiconductor device on the assembly work station.

4. In the apparatus of claim 1 wherein said vertically extending structure includes not only said mounting portion but a tubular means to which a vacuum can be applied to lift a semiconductor unit from the work station therefor to the assembly work station for assembly with other parts including the mounting means and leads.

5. In the apparatus of claim 1 which includes a movable turret structure mounted in the apparatus supporting the horizontally extending structure, vibrator means with said turret structure with the horizontally extending structure including a horizontally extending post which is vibrated by said vibrator means.

6. In the apparatus of claim 1 wherein the horizontally extending structure includes two posts which are each movable in a vertical direction with respect to the work table of the apparatus and independently of one another.

7. In the apparatus of claim 3 wherein means are provided on each movable supporting means to simultaneously pivotally actuate each said substantially T-shaped member to place the lifting arm portion of each under a completed semiconductor device at the assembly work station and after movement of the vertically extending structure away from said work station to simultaneously release said lifting arm portion from such device to deposit the same.

8. In the apparatus of claim 1 wherein the vertically extending structure includes means to transport a semiconductor unit to said assembly work station and impress said unit onto the semiconductor device being assembled.

* * * * *